(12) United States Patent
Yamada

(10) Patent No.: US 6,770,409 B2
(45) Date of Patent: Aug. 3, 2004

(54) METHODS FOR STIMULATING RESIST DEVELOPMENT IN MICROLITHOGRAPHY

(75) Inventor: Atsushi Yamada, Yokohama (JP)

(73) Assignee: Nikon Corporation, Tokyo (JP)

( * ) Notice: Subject to any disclaimer, the term of this patent is extended or adjusted under 35 U.S.C. 154(b) by 127 days.

(21) Appl. No.: 10/231,822

(22) Filed: Aug. 28, 2002

(65) Prior Publication Data

US 2003/0044703 A1 Mar. 6, 2003

(30) Foreign Application Priority Data

Aug. 29, 2001 (JP) ........................................ 2001-259455

(51) Int. Cl.$^7$ ................................................ G03F 9/00
(52) U.S. Cl. .......................................... 430/30; 703/13
(58) Field of Search .............................. 430/30; 703/13

(56) References Cited

PUBLICATIONS

Jewett et al., "Line–Profile Resist Development Simulation Techniques,"*Polymer Engineering and Science* vol. 17, No. 6: 381–384, Jun. 1977.

Kobinata et al., "Proximity Effect Correction by Pattern Modified Stencil Mask in Large–Field Projection Electron–Beam Lithography,"*Jpn. J. Appl. Phys.* vol. 37, Part 1, No. 12B: 6767–6773, Dec. 1998.

*Primary Examiner*—Christopher G. Young
(74) *Attorney, Agent, or Firm*—Klarquist Sparkman, LLP

(57) ABSTRACT

Methods are disclosed for simulating the profiles of pattern elements, as formed in a layer of developed resist on a lithographic substrate, wherein the simulated profiles of pattern elements closely correspond to actual lithographic results realized after lithographic exposure and development of the resist. The simulation is based on calculations of resist development that take into account a distribution of resist-development rate. The post-development profile of pattern elements as formed in the resist is estimated by focusing on the separation of resist molecules that occurs during resist development, wherein the simulation calculations are based on the assumption that, in each of multiple increments along the edges of pattern elements, each molecule of the resist material is separated from the layer of resist.

20 Claims, 5 Drawing Sheets

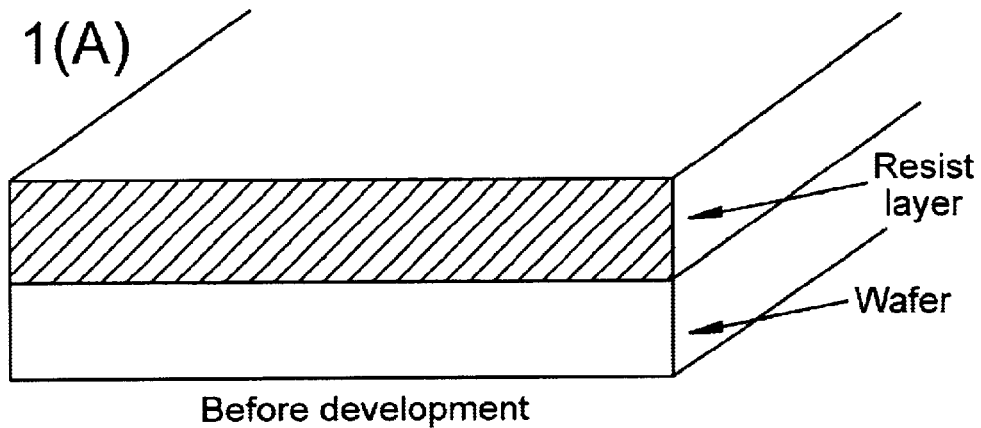
FIG. 1(A) Before development
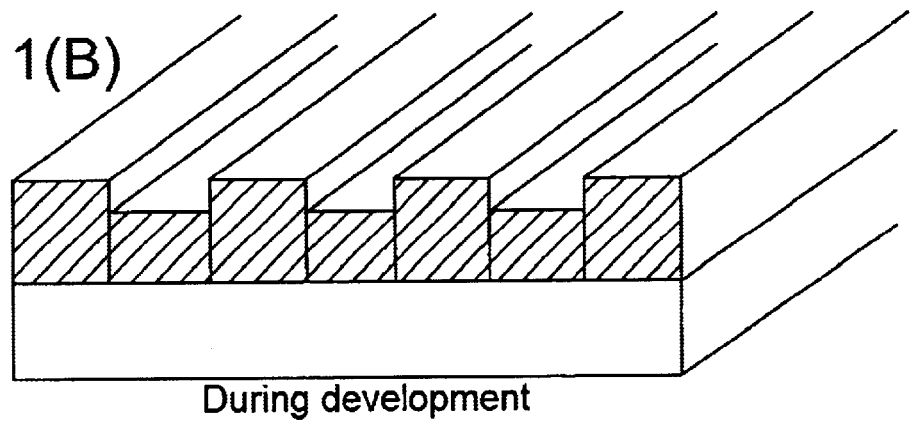
FIG. 1(B) During development
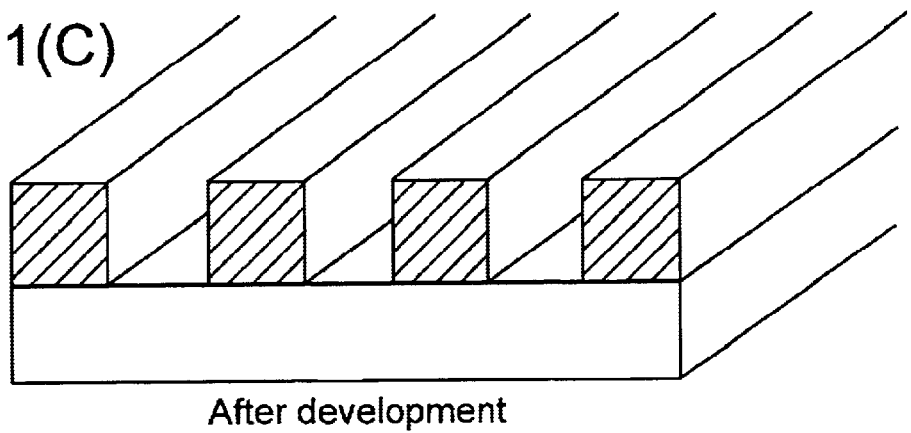
FIG. 1(C) After development

FIG. 2(A)
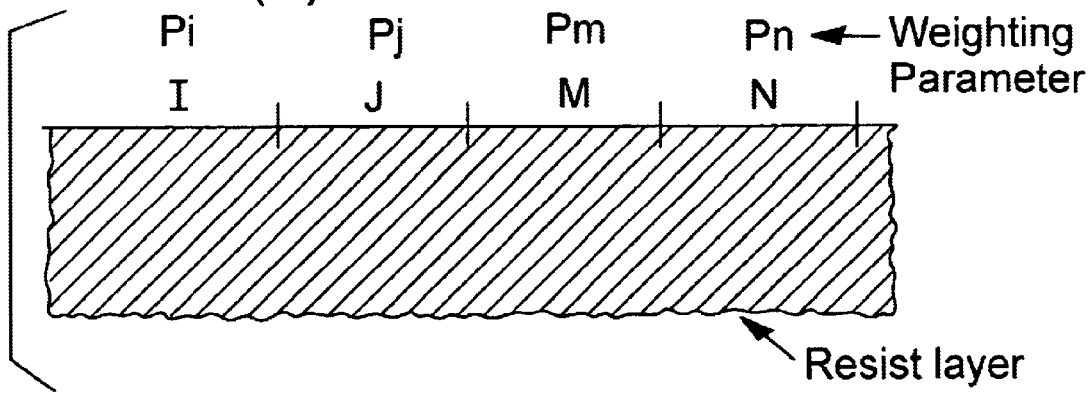
FIG. 2(B)
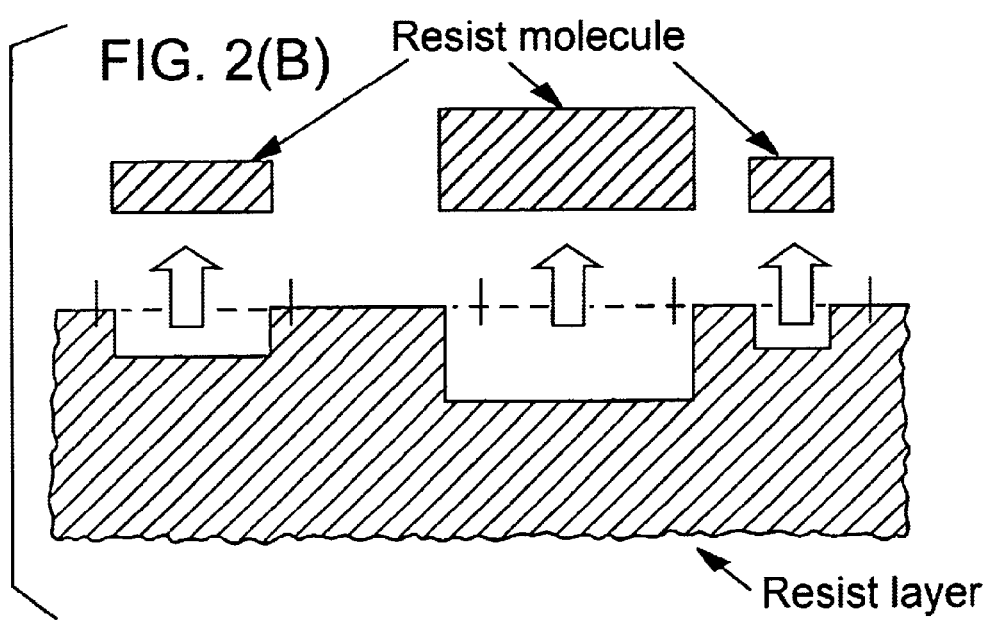
FIG. 2(C)
$S_i = V_i^{2/3} = W_i \cdot D_i$
$\therefore D_i = S_i / W_i$
$= V_i^{2/3} / W_i$

METHODS FOR STIMULATING RESIST DEVELOPMENT IN MICROLITHOGRAPHY

FIELD

This disclosure pertains to microlithography, which is a key technology used in the manufacture of micro-electronic devices such as semiconductor integrated circuits, displays, and the like. More specifically, the disclosure pertains to methods for predicting the respective profiles of pattern elements, as projected onto a resist layer of a microlithographic substrate, after development of the resist.

BACKGROUND

During projection microlithography, a pattern (usually comprising an enormous number of pattern elements) defined on a reticle is projected by the beam onto the surface of a suitable substrate such as a semiconductor wafer. So as to be imprintable with an image of the projected pattern, the upstream-facing surface of the substrate is coated with a suitable exposure-sensitive material, termed a "resist." Especially with patterns comprised of extremely small elements, the shapes (profiles) of individual elements as projected onto the substrate frequently differ from respective design-mandated profiles for the elements. These changes in profile can yield less than satisfactory microlithographic results. Hence, before patterns actually are projection-exposed, simulations desirably are performed to predict the as-printed profiles of the pattern elements.

In charged-particle-beam (CPB) microlithography (e.g., electron-beam microlithography) the conventional method for estimating the as-printed profiles of pattern elements is an extensive calculation based on the spatial distribution of exposure energy accumulated in the exposed resist at the time of resist development. The calculation is based on the well-known Monte Carlo simulation method, in which method the trajectories of electrons scattered within the resist are simulated by assigning directions to the trajectories according to random numbers. The electrons are assumed to undergo scattering events due to elastic interactions with atoms in molecules of the resist, wherein each scattering event results in loss of energy of the participating electron. The scattering events also result in corresponding "exposure" reactions involving the molecules of the resist. The resulting local accumulation of exposure energy within the resist due to the scattering electrons is calculated, and the cumulative exposure-energy data are converted to corresponding local rates of resist "development." The development calculation is performed (e.g., by a string method) using the resulting spatial distribution of the rate of resist development, yielding predictions of corresponding profiles of pattern elements after resist development. This method is described in "Line-Profile Resist Development Simulation Techniques," *Polymer Eng. Sci.* 17:381 (1977).

However, with increasing demand for ever-smaller sizes of critical circuit elements in microelectronic devices, a need has arisen not only for predictions of the cross-sectional (two-dimensional) profiles of pattern elements realized after resist development but also for predictions of three-dimensional ("3D" or "bird's-eye") profiles. To produce a 3D profile using a conventional Monte Carlo simulation in which scattering is simulated using random numbers requires an extremely long calculation time and use of a computer having an extremely large memory.

As a result, investigations of alternative calculation techniques have been investigated, such as making a respective table of the spatial distribution of cumulative exposure energy (an "Exposure Intensity Distribution" or "EID" function) after calculating the scattering of electrons entering the resist at a given point. Each table is stored in memory and recalled as required for fitting to a simple function so as to compress the volume of data. For example, see Kobinata et al., "Proximity Effect by Pattern-Modified Stencil Mask in Large-Field Projection Electron-Beam Lithography," *Jpn. J Appl. Phys.* 37:6767 (1998). According to this paper, in a deceleration region of about 10 keV in the resist, if the EID function is expressed as a linear sum of two Gaussian distributions, the calculated results agree well with actual exposure results.

The spatial distribution of cumulative exposure energy over the entire resist is determined by calculations in which the EID function is superimposed over the entire resist. The resulting cumulative-energy data are converted to corresponding resist-development rates. But, this conversion involves using a simple analytical formula that only roughly approximates the chemical reaction involved in development of the particular resist. Furthermore, the parameters of the analytical formula are adjusted suitably to simplify the calculation.

Recently, there has been a much-increased demand for resist-development simulations that can predict accurately the development behavior of very fine pattern elements (e.g., elements having linewidths of 100 nm or less) projected onto the resist. Under these conditions, prediction of as-developed profiles of pattern elements conventionally cannot be performed with sufficient accuracy, even by using resist-development models that approximate development of the well-understood polymethylmethacrylate (PMMA) resists (which conventionally are used as positive resists) or by the Mack formula (known to be useful for chemically enhanced resists). These obstacles also exist for negative resists. For example, the edge of an actual pattern element having these dimensions, as printed in a developed resist, frequently is distorted by irregularities in the pattern-element edge (i.e., by "edge roughness") and hence has an irregular profile. But, because conventional resist-development simulations produce smooth edges, actual effects of edge roughness are not appropriately reflected in the simulation results.

SUMMARY

In view of the shortcomings of conventional simulation methods, the present invention provides, inter alia, simulation methods that more closely approximate the profiles of projection-transferred pattern elements as formed in the resist after exposure and resist development.

According to one aspect of the invention, methods are provided for simulating the profiles of pattern elements as projection-exposed onto a layer of resist, wherein the methods yield estimates of the cross-sectional post-development profile of the resist along edges of pattern elements. The simulation includes a calculation based on the two-dimensional distribution of the rate of resist development. In a first step of the method, with respect to a layer of the resist, data are input concerning the distribution of molecular weight and of mean density of the resist. In a second step, from the input data, a volume distribution of molecules of the resist is calculated. In a third step, a line (extending along a resist cross-section and indicating a line of contact of the surface of the resist with a resist-developer solution) is divided into increments desirably having equal respective lengths. In a fourth step, based on the distribution of development rate for the resist, respective weighting parameters are assigned to each increment. In a fifth step, after a selected amount of resist-development time, a determination is made of whether separation has occurred in each increment. This determination is made using respective random numbers weighted by the weighting parameters used in the fourth step. A sixth step is performed under the assumption that each molecule of the resist is separated from the layer of resist in each increment in which separation of resist molecules is going to occur. In the sixth step, for each such increment, the respective volume of separated resist molecules is determined using respective random numbers weighted based on the volume distribution calculated in the second step. In a seventh step, using random numbers, respective widths of the volumes of separated resist molecules are determined. Also calculated are the respective depths of the volumes determined in the sixth step. Finally, according to an array of the respective depths of the volumes, a line is extended connecting the depths. The line indicates a simulated profile of the resist surface after separation.

The method further can comprise the step, after the last step described above, of repeating the third through eighth steps as required until the total resist-development time is equal to a predetermined resist-development time. If the predetermined resist-development time has been reached, the simulation is ended. If not, the simulation returns to the third step.

The method further can comprise the step, after the eighth step described above, of estimating the profile of the pattern element after development of the resist.

According to another aspect of the invention, methods are provided for simulating the three-dimensional ("bird's-eye") profiles of developed resist corresponding to an exposed pattern element. The simulation includes a calculation based on the three-dimensional distribution of the rate of resist development. In a first step, with respect to a layer of the resist, data are input concerning the distribution of molecular weight and the mean density of the resist. In a second step, from the input data, a volume distribution of molecules of the resist is calculated. In a third step, an area of contact of a surface of the resist with a resist-developer solution is divided into increments desirably having equal respective areas. In a fourth step, based on a distribution of development rate for the resist, respective weighting parameters are assigned to each increment. In a fifth step, after a selected amount of resist-development time, a determination is made, using respective random numbers weighted using the weighting parameters used in the fourth step, of whether separation has occurred in each increment. A sixth step is performed under the assumption that each molecule of the resist is separated from the layer of resist in each increment in which separation of the resist molecules is going to occur. For each such increment the respective volume of separated resist molecules is determined using respective random numbers that are weighted based on the volume distribution calculated in the second step. In a seventh step, an assumption is made that each volume of separated resist molecules is shaped as a respective rectangular parallelepiped having a respective bottom surface with respective long and short sides and rotational angle. From the respective volumes of separated resist molecules determined in the sixth step, for each parallelepiped the ratio of the respective lengths of the long side and short side as well as the rotational angle are determined. Also, for each parallelepiped the areas of the respective bottom surfaces and the respective depth of the parallelepiped are calculated. In an eighth step, according to the respective bottom surface areas and depths, a line is extended indicating a profile of the resist surface after separation has occurred.

The method summarized above further can comprise the step, after the eighth step, of repeating the third through eighth steps as required until the total resist-development time is equal to a predetermined resist-development time.

According to conventional simulation methods, whenever a resist-development calculation is performed using the spatial distribution of the rate of resist development, the region of the resist that was the subject of the calculation was regarded as exhibiting a smooth, continuous body. Consequently, the results of the simulations did not account appropriately for edge roughness of pattern elements as imprinted into the resist. The present methods, on the other hand, reflect the separation of resist molecules that occurs during resist development. The present methods also are based on an assumption that each molecule of the resist is separated from the layer of resist in each region (increment) in which separation of the resist molecules is going to occur. As a result, the simulation results obtained with the present methods more closely approximate the behavior of actual developed resists as well as actual pattern-element profiles formed in such resists, including edge roughness. Thus, the present methods accurately predict effects of edge roughness on the respective profiles of pattern elements formed in the developed resist, as well as the limits on how narrowly a pattern element can be as formed in the developed resist. It is also possible, using the present methods, to calculate the optimum sizes of molecules of the resist material and to optimize the mean molecular weight or the distribution of molecular weight of the resist material.

The foregoing and additional features and advantages of the invention will be more readily apparent from the following detailed description, which proceeds with reference to the accompanying drawings.

BRIEF DESCRIPTION OF THE DRAWINGS

FIGS. 1(A)–1(C) are oblique views depicting certain concepts of separation that occurs during resist development. FIG. 1(A) shows a region of a substrate ("wafer") that includes a surficial layer of resist. FIG. 1(B) shows the region of the wafer that has been placed in contact with a developer and is undergoing (but has not completed) development. FIG. 1(C) shows the region after development is complete, revealing a "pattern" defined by the remaining insoluble regions separated from one another by intervening voids in the resist layer.

FIGS. 2(A)–2(C) are respective elevational sections of a region of a wafer subjected to certain respective steps of the method according to the First Example Embodiment. FIG. 2(A) shows four equal-length increments I, J, M, N formed in the third step of the method. FIG. 2(B) shows, for the increments in FIG. 2(A), separation of respective volumes of resist molecules from the layer of resist, wherein the volumes are found using respective random numbers that are weighted based on a volume distribution calculated in an earlier step. FIG. 2(C) shows an exemplary area, designed Si, of an increment I, and shows how to calculate the respective depth (Di) of separated resist molecules from a respective width (Wi) determined using random numbers and the respective volume (Vi) of separated resist molecules.

DETAILED DESCRIPTION

Figure 3:
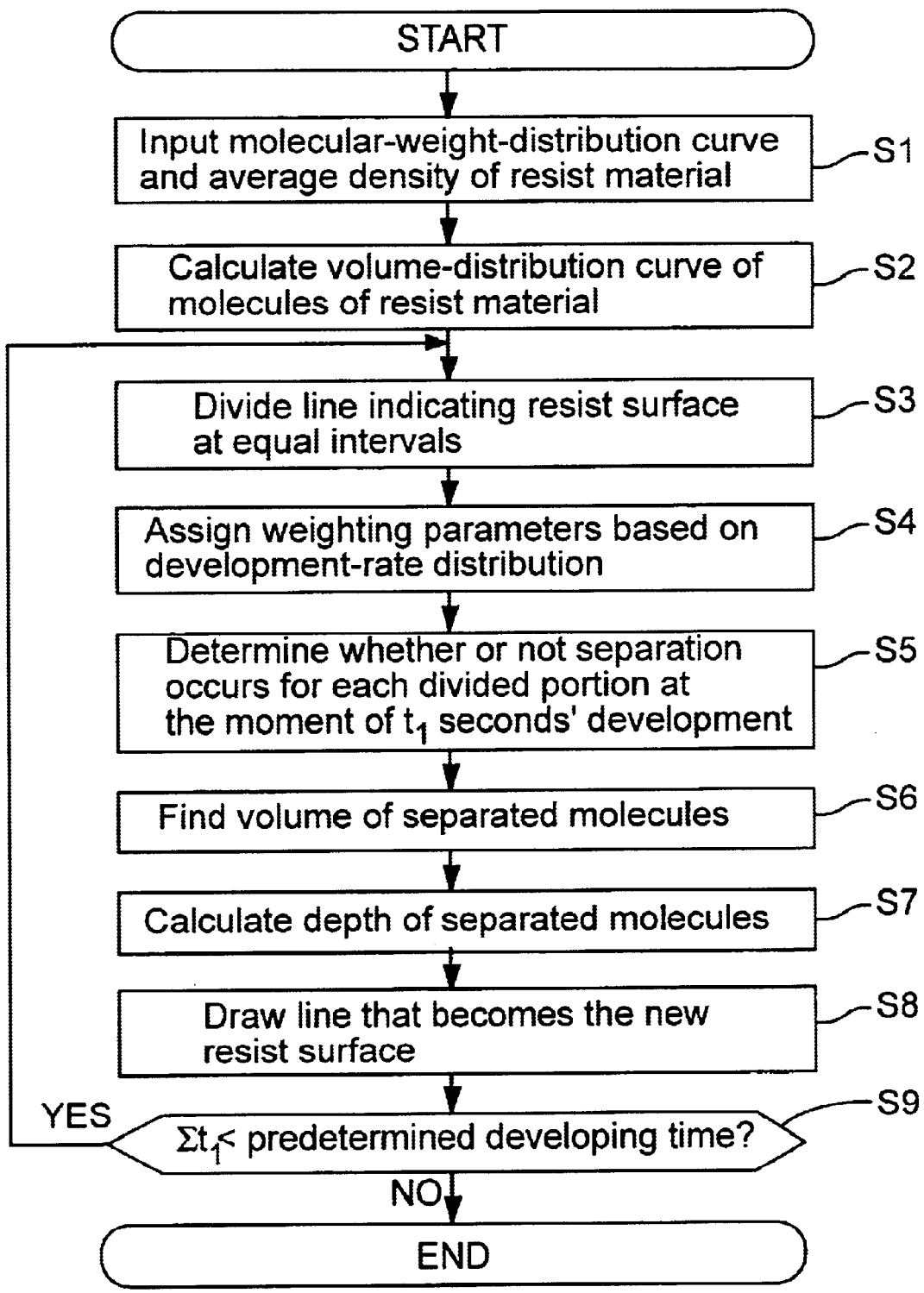
FIG. 3 is a flowchart of a First Example Embodiment of a resist-development-simulation method yielding a simulated 2D profile of a pattern element as formed in developed resist.

The invention is described below in the context of example embodiments that are not intended to be limiting in any way.

General Considerations

The embodiments described below refer to the phenomenon of "separation" of resist molecules that occurs during resist development, after resist exposure. Separation is described below.

In microlithography, as noted above, the substrate is rendered imprintable with a pattern by application of a layer of resist to the surface of the substrate. During exposure, incidence of exposure energy (photons or charged particles) causes local chemical changes in the resist that result in formation of a latent image of the pattern in the resist layer. For example, a local region of a "negative" resist receiving an exposure "dose" undergoes polymerization and/or crosslinking of relatively low-molecular-weight resist molecules (monomers and/or oligomers) in the resist layer to form high-molecular-weight polymers and/or molecular aggregates. Conversely, a local region of a "positive" resist receiving an exposure "dose" undergoes scission reactions that break up large-molecular-weight polymers and/or molecular aggregates in the resist layer into relatively low-molecular-weight molecular fragments (oligomers, monomers, etc.).

After making the exposure, the resist layer must be "developed" to convert the latent image into a corresponding 3-dimensional relief image of the pattern on the substrate. In the relief image, pattern elements are defined by respective areas where resist is present versus areas where resist is absent. As discussed above, resist exposure results in regions of the resist layer that contain predominantly low-molecular-weight molecules and other regions that contain predominantly high-molecular-weight polymers. Development frequently is performed by a "liquid" process, but "dry" development processes are also known. With respect to a liquid development process, the low-molecular-weight molecules in the layer of exposed resist are "soluble" and the high-molecular-weight polymers and molecular aggregates are relatively "insoluble." Liquid development processes typically involve contact of the exposed resist layer with a "developer" liquid comprising a solvent that selectively removes the "soluble" molecules but not the "insoluble" polymers. The developer also can contain other liquid compounds that, for example, help minimize swelling of the regions of insoluble polymers.

Basically, resist "separation" involves the selective removal of the relatively low-molecular-weight molecules from the layer of exposed resist while leaving the relatively high-molecular-weight polymers and/or molecular aggregates behind on the substrate surface. This basic concept is depicted in FIGS. 1(A)–1(C). In FIG. 1(A), a substrate ("wafer") is shown that includes a surficial layer of resist. Although not detailed in the figure, the resist has been exposed, and thus has a latent image of the pattern projection-exposed onto the resist layer, but has not yet been developed. The latent image includes local areas of soluble molecules and other areas of insoluble polymers and molecular aggregates. In FIG. 1(B), the wafer has been placed in contact with a developer and is undergoing (but has not completed) development, forming "low" regions that contrast with the intervening "high" regions. The "low" regions are respective regions of soluble molecules that are being removed by the developer, and the "high" regions are respective regions of insoluble polymers. In FIG. 1(C), development is complete, revealing a "pattern" defined by the remaining insoluble regions of the resist layer separated from one another by intervening voids in the resist layer.

In the partial-development situation shown in FIG. 1(B), "separation" is a phenomenon occurring on the surface of the "low" regions. During separation in a liquid development process, the soluble molecules are becoming solvated and are leaving the surface by dissolution in the solvent. Again, as noted above, the soluble molecules are not limited to actual "monomers," but can consist of or include other relatively low-molecular-weight species such as oligomers (dimers, trimers, scission products, etc.) As a soluble molecule leaves the resist surface and enters the solvent, it becomes separated from the resist layer.

In the following description, a "resist molecule" means a molecule of the resist material. Depending upon the type of resist, the resist molecule can be a molecule, monomer, dimer, trimer, or other oligomer or scission molecule, or a polymer and/or molecular aggregate formed from monomers or other oligomers.

First Example Embodiment

This embodiment is directed to simulating the cross-sectional (2D) profile of an imprinted independent pattern element in a chemically enhanced negative resist developed for 60 seconds after exposure. For exposure, the beam-acceleration voltage was 100 keV, the irradiation dose was $30 \mu C/cm^2$, and the resist thickness was 300 nm. The pattern element as imprinted into the resist had a nominal width of 100 nm, and the beam blur was assumed to be 70 nm.

First, taking into account beam shape (including beam blur), the spatial distribution of cumulative exposure energy in the resist was calculated. Based on the resulting spatial distribution of cumulative exposure energy, the rate of resist development was determined using the following "conversion formula" for a negative resist:

$$R(D)=R_0[1-(C_{AS}(D)/C_0)^m]^\alpha \qquad (1)$$

wherein $C_{AS}=1-\exp(-\gamma D)$; $\gamma$ is an experimental constant (in units of $m^3/J$); $R(D)$ is the dissolution speed of the resist (resist-development rate, in units of m/s); $D$ is cumulative exposure energy (in units of $J/m^3$); $R_0$ is an experimental constant (in units of m/s); $D_0$ is an experimental constant (in units of $J/m^3$); and $C_0$, "m", and $\alpha$ are respective experimental constants that are unit-less. A conversion formula for a positive resist is different, as discussed later below.

The method, according to this embodiment, used for simulating the resist development is shown in the flowchart of FIG. 3.

In a first step S1 of the method, data are input regarding the shape of the molecular-weight-distribution curve and the average density of the resist material of the particular chemically enhanced negative resist that is being used. As these data are input to facilitate determinations of the volume of separated resist molecules in later steps, the molecular-weight-distribution curve reflects the distribution of molecular weight of the resist molecules that separate from the layer of resist. "Molecular-weight" as used here means the molecular weight of a resist molecule separated from the layer of resist. In one case, the resist molecule is separated as a molecule or monomer of the resist material. In another case, the resist molecule is separated as an oligomer such as a dimer, trimer, or general scission fragment of the resist material.

In a second step S2 a volume distribution of the resist molecules is calculated from the average density of the resist material and from the molecular-weight-distribution curve.

In a third step S3, assuming that a resist cross-section is being profiled, a line indicating the resist surface that comes into contact with the resist-developer solution is divided into equal-length increments. In this regard, reference is made to FIG. 2(A) that shows four equal-length increments I, J, M, N.

In a fourth step S4, based on a distribution of the rate of resist development, a respective weighting parameter is assigned to each increment. See FIG. 2(A), showing respective weighting parameters Pi, Pj, Pm, Pn corresponding to the respective increments I, J, M, N. The weighting parameters indicate respective degrees of ease of separation that occurs during resist development.

After the resist has developed for t, seconds, the fifth step S5 is performed, in which a determination is made of whether separation has occurred in each increment. I.e., a determination is made of whether the resist molecule has been separated from the resist. This determination is made according to the respective weighting parameter and using random numbers. Specifically, for example, the probability of separating the resist molecule from the layer of resist and the rate of resist development are regarded as being proportional to each other.

In the sixth step S6, if resist separation occurs in an increment, it is assumed that each molecule of the resist is separated from the layer of resist in each increment in which separation of resist molecules is going to occur. In the various increments respective volumes of the resist molecules that are going to be separated from the layer of resist are found using respective random numbers that are weighted based on the volume distribution calculated in step S2 (see FIG. 2(B)). In FIG. 2(C) the 2-dimensional area (Si) of the increment I is shown. In the figure, $Si=(Vi)^{2/3}=(Wi)(Di)$, wherein Vi is the respective volume of separated resist molecules calculated in this step, Wi is the respective width of separated resist molecules determined using random numbers, and $Di=(Vi)^{2/3}/Wi$.

In the seventh step S7, in each increment a respective width of the resist molecule is determined using random numbers. For example, in FIG. 2(C) the width of the resist molecule in the increment I is denoted Wi. From the determined width and from the volume of the resist molecule determined in step S6, a depth of the resist molecule is calculated. For example, in FIG. 2(C) the depth of the resist molecule in the increment I is denoted Di, wherein $Di=(Vi)^{2/3}/Wi$.

In the eighth step S8, using the respective depths of the resist molecules in each increment calculated in step S7, a line is extended to indicate the profile of the corresponding surface of the resist after separation and to reveal the new resist surface that will make contact with the resist-developer solution.

In the ninth step S9 a determination is made of whether the summed development times ($\Sigma t_i$; in units of seconds) have reached the predetermined development time (60 seconds in this example). If $\Sigma t_i=60$ seconds, then the resist-development calculation ends, thereby ending the simulation. If $\Sigma t_i<60$ seconds, then the simulation returns to the third step S3, in which a line indicating a new resist surface is divided into equal increments. If the simulation has ended, then the resulting cross-sectional profile of the element in the layer of developed resist is as shown, for example, in FIG. 4.

In the embodiment described above, in the third step S3, the increments produced by the division desirably are shorter than the size of individual monomers of the resist material.

In this example embodiment the respective volumes of separated resist molecules in the increments were determined using the volume-distribution curve. However, good results also can be achieved if the resist-development calculation is performed using an average volume calculated from the average density and average molecular weight of the resist material.

Comparative Example 1

Figure 4:
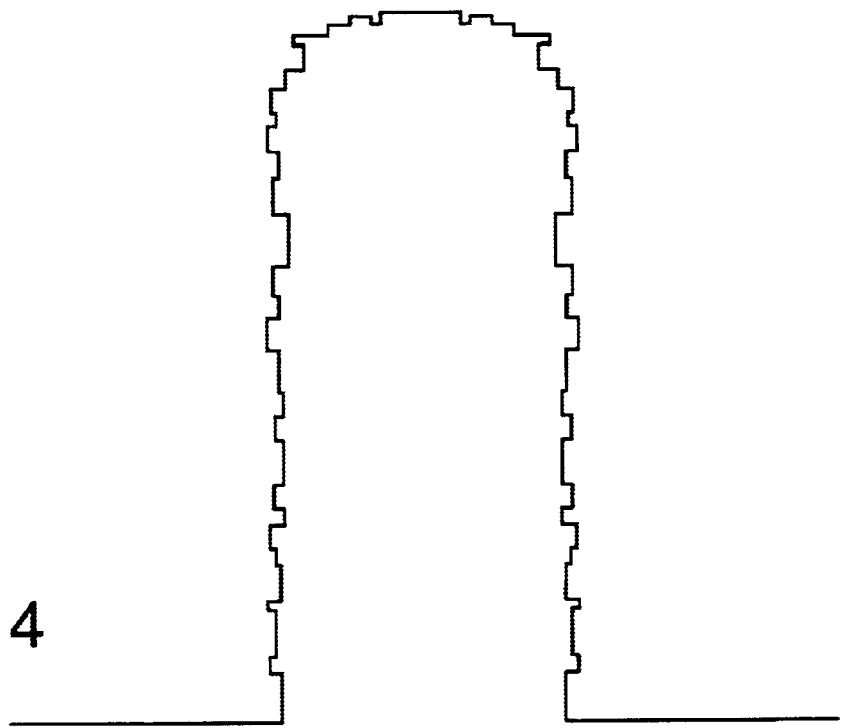
FIG. 4 is a plan view of an exemplary pattern element having an edge profile simulated using the method shown in FIG. 3.
Figure 5:
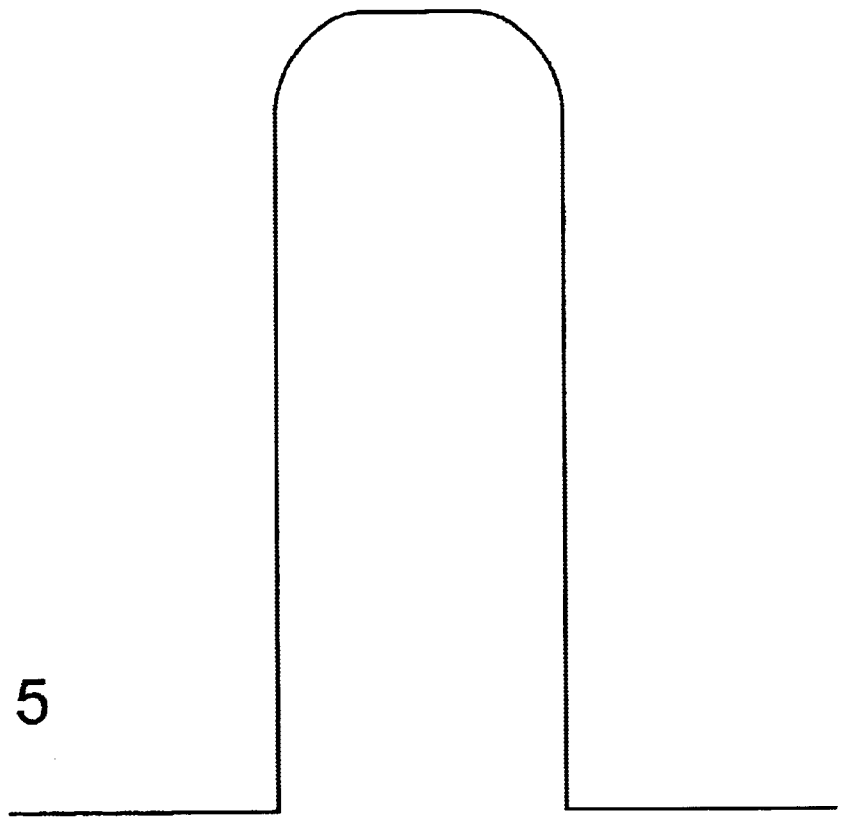
FIG. 5 is, as a Comparison Example, a plan view of an exemplary pattern element having an edge profile simulated using a conventional simulation method.

For comparison purposes, a profile of the same pattern element investigated in Example Embodiment 1 was determined by a simulation performed using a conventional model of resist development. FIG. 5 shows an exemplary cross-sectional profile that was obtained. In FIG. 5 the cross-sectional profile of the resist appears as a smooth fine. In FIG. 4, in contrast, results obtained using the method of FIG. 3 reveal a profile having fine edge roughness. The profile in FIG. 4 more closely approximates the actual cross-sectional profile of the element in a developed layer of resist.

Second Example Embodiment

This embodiment is directed to simulating a "bird's-eye" (3D) profile of an imprinted independent pattern element in a chemically enhanced negative resist developed for 60 seconds after exposure. For exposure, the beam-acceleration voltage was 100 keV, the irradiation dose was 30 $\mu C/cm^2$, and the resist thickness was 300 nm. The pattern element as imprinted into the resist had a nominal width of 100 nm, and the beam blur was assumed to be 70 nm.

First, taking into account beam shape (including beam blur), the spatial distribution of cumulative exposure energy in the layer of resist was calculated. Based on the resulting spatial distribution of cumulative exposure energy, the rate of development was determined using the "conversion formula" of Equation (1), above.

Figure 6:
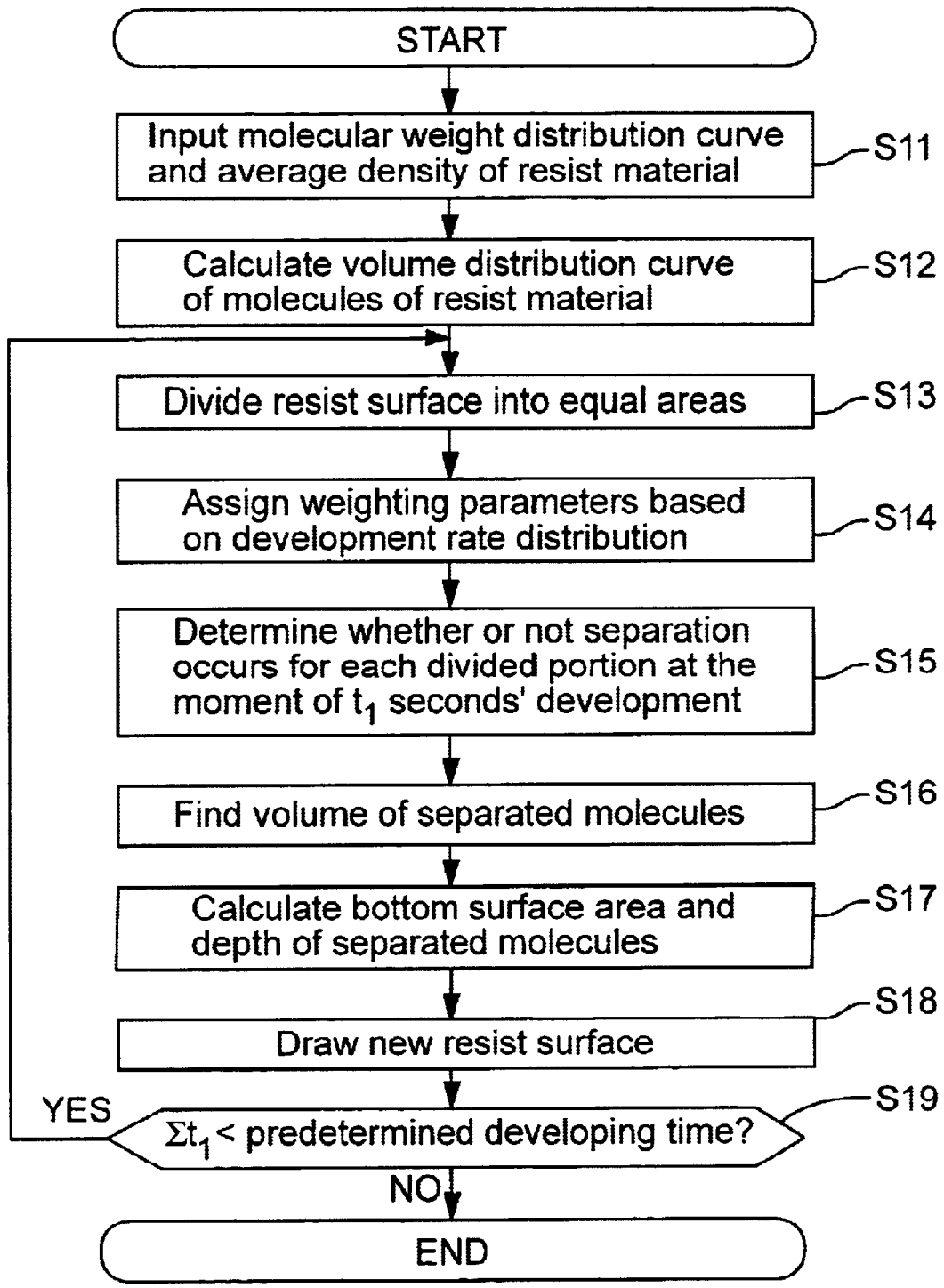
FIG. 6 is a flowchart of a Second Example Embodiment of a resist-development-simulation method yielding a simulated 3D (bird's-eye view) profile of a pattern element as formed in the developed resist.

The method, according to this embodiment, used for calculating the resist development is shown in the flowchart of FIG. 6.

In a first step S11 of the method, data are input regarding the shape of the molecular-weight-distribution curve and the average density of the resist material of the particular chemically enhanced negative resist that is being used. As in Example Embodiment 1, the molecular-weight-distribution curve reflects the distribution of molecular weight of the resist molecules that separate from the layer of resist during resist development.

In a second step S12, a volume distribution of the resist molecules is calculated from the average density of the resist material and from the molecular-weight-distribution curve.

In a third step S13 the surface of the resist that comes into contact with the resist-developer solution is divided into equal-area increments.

In a fourth step S14, based on a distribution of the rate of resist development, a respective weighting parameter is assigned to each increment. The weighting parameters indicate respective degrees of ease of resist separation during resist development.

After the resist has developed for to seconds, the fifth step S15 is performed, in which a determination is made of whether separation has occurred in each increment. The determination is made according to the respective weighting parameter and using random numbers. Specifically, for example, the probability of separating the resist molecule from the layer of resist and the rate of resist development are regarded as being proportional to each other.

In the sixth step S16, if resist separation occurs in an increment, it is assumed that each molecule of the resist is separated from the layer of resist in each increment in which separation of resist molecules is going to occur. In the various increments respective volumes of the resist molecules that are going to be separated from the layer of resist are found using respective random numbers that are weighted based on the volume distribution calculated in step S12.

The respective shapes of volumes containing separated resist molecules are assumed to be respective rectangular parallelepipeds. The bottom surface of each parallelepiped has a respective ratio of the lengths of the long and short sides thereof, as well as a respective angle of rotation determined using respective random numbers. The respective data concerning the ratio and angle of rotation yield data concerning the respective area of the bottom surface of each parallelepiped. In the seventh step S17 the "depths" of the respective parallelepipeds are calculated from the respective volumes of separated molecules in each increment determined in step S16.

In the eighth step S18, the respective volume of the rectangular parallelepiped of separated molecules is subtracted from the surface, thereby producing a respective portion of the pattern-element profile in the resist surface. Using respective data concerning the bottom surface and depth of the parallelepipeds, a surface is derived that corresponds to the new resist surface that will make contact with the resist-developer solution.

In the ninth step S19 a determination is made of whether the summed development times ($\Sigma t_i$; in units of seconds) have reached the predetermined development time (60 seconds in this example). If $\Sigma t_i = 60$ seconds, then the resist-development calculation ends, thereby ending the simulation. If $\Sigma t_i < 60$ seconds, then the simulation returns to the third step S13, in which a line indicating a new resist surface is divided into equal increments. If the simulation has ended, then the resulting bird's-eye view of the element in the layer of developed resist reveals a surface having a fine edge profile that closely approximates the edge roughness of an actual pattern element defined in the resist (FIG. 6).

For comparison purposes the 3D profile of a pattern element as formed in a resist was determined using a conventional resist-development-calculation method, yielding a simulation in which the pattern element exhibits a smooth curved surface profile.

In this example embodiment, in the third step S13 the increments desirably are made smaller than the minimum volume of individual monomers of the resist material.

In the embodiments described above, examples were used in which the volumes of separated resist molecules were as in their respective volume-distribution curves. Similar benefits can be achieved by performing the resist-development calculation using average volumes determined from the mean density and mean molecular weight of the resist material.

Also, although the example embodiments were described above in the context of using a negative resist, it also is possible to apply the methods disclosed herein with equal facility to use of a positive resist. When using a positive resist, the development-rate conversion expressed in Equation (2) is used:

$$R(D) = R_0 (C_m + D/D_0)^\alpha \qquad (2)$$

wherein $R(D)$ is the development (dissolution) rate of the resist (in units of m/s); D is the cumulative exposure energy (in units of J/m$^3$); $R_0$ is an experimental constant (in units of m/s); $D_0$ is an experimental constant (in units of J/m$^3$); and $C_m$ and $\alpha$ are respective experimental constants that are unit-less.

As ascertainable from the foregoing, instead of treating the region of the resist (that is the subject of the resist-development calculation) as a continuous body, the methods disclosed herein focus on the separation behavior of molecules of the resist material. Since each molecule of the resist is separated from the layer of resist during development, the present methods yield pattern-element profiles that more closely correspond to actual pattern-element profiles (including edge roughness) as manifest in the resist after development of the resist. In addition, the present methods provide more accurate simulations of pattern elements formed at or near resolution limits.

Whereas the invention has been described in connection with multiple example embodiments, it will be understood that the invention is not limited to those embodiments. On the contrary, the invention is intended to encompass all modifications, alternatives, and equivalents that may be included within the spirit and scope of the invention, as defined by the appended claims.

What is claimed is:

1. In a microlithography process, a method for simulating the cross-sectional profile of developed resist corresponding to an exposed pattern element, the method comprising the steps:
   (a) with respect to a layer of the resist, inputting data concerning a distribution of molecular weight and of mean density of the resist;
   (b) from the input data, calculating a volume distribution of molecules of the resist;
   (c) at a resist cross-section, dividing a line, indicating contact of a surface of the resist with a resist-developer solution, into increments;
   (d) based on a distribution of development rate for the resist, assigning respective weighting parameters to each increment;
   (e) after a selected amount of resist-development time, determining, using respective random numbers weighted by the weighting parameters used in step (d), whether separation has occurred in each increment;
   (f) assuming that each molecule of the resist is separated from the layer of resist in each increment in which separation is going to occur, determining for each such increment a respective volume of separated resist molecules, using respective random numbers weighted based on the volume distribution calculated in step (b);
   (g) using random numbers, determining respective widths of the volumes of separated resist molecules and calculating respective depths of the volumes determined in step (f); and
   (h) according to an array of the respective depths of the volumes, extending a line connecting the depths, the line indicating a simulated profile of the resist surface after separation.

2. The method of claim 1, wherein in step (c) the increments have equal respective lengths.

3. The method of claim 1, further comprising the step, after step (h), of repeating steps (c)–(h) as required until total resist-development time is equal to a predetermined resist-development time.

4. The method of claim 3, further comprising the step, if the predetermined resist-development time has been reached, of ending the simulation.

5. The method of claim 1, further comprising the step, after step (h), of estimating the profile of the pattern element after development of the resist.

6. The method of claim 1, wherein the resist is a negative resist.

7. The method of claim 6, wherein the rate of resist development utilized in step (d) is according to the expression:

$$R(D)=R_0[1-(C_{AS}(D)/C_0)^m]^\alpha$$

wherein $C_{AS}=1-\exp(-\gamma D)$; $\gamma$ is an experimental constant, in units of $m^3/J$; $R(D)$ is the dissociation speed of the resist, in units of m/s; D is cumulative exposure energy, in units of $J/m^3$; $R_0$ is an experimental constant, in units of m/s; and $C_0$, "m", and $\alpha$ are respective unit-less experimental constants.

8. The method of claim 1, wherein the resist is a positive resist.

9. The method of claim 8, wherein the rate of resist development utilized in step (d) is according to the expression:

$$R(D)=R_0(C_m+D/D_0)^\alpha$$

wherein $R(D)$ is in units of m/s; D is cumulative exposure energy, in units of $J/m^3$; $R_0$ is an experimental constant, in units of m/s; $D_0$ is an experimental constant, in units of $J/m^3$; and $C_m$ and $\alpha$ are unit-less experimental constants.

10. In a microlithography process, a method for simulating a 3D profile of developed resist corresponding to an exposed pattern element, the method comprising the steps:

(a) with respect to a layer of the resist, inputting data concerning a distribution of molecular weight and of mean density of the resist;

(b) from the input data, calculating a volume distribution of molecules of the resist;

(c) dividing an area, indicating contact of a surface of the resist with a resist-developer solution, into increments;

(d) based on a distribution of development rate for the resist, assigning respective weighting parameters to each increment;

(e) after a selected amount of resist-development time, determining, using respective random numbers weighted by the weighting parameters used in step (d), whether separation has occurred in each increment;

(f) assuming that each molecule of the resist is separated from the layer of resist in each increment in which separation is going to occur, determining for each such increment a respective volume of separated resist molecules, using respective random numbers weighted based on the volume distribution calculated in step (b);

(g) assuming that each volume of separated resist molecules is shaped as a respective rectangular parallelepiped having a respective bottom surface with respective long and short sides and rotational angle, and from the respective volumes of separated resist molecules determined in step (f), determining for each parallelepiped a ratio of the respective lengths of the long side and short side and the rotational angle, calculating for each parallelepiped the areas of the respective bottom surfaces, and calculating for each parallelepiped a respective depth; and (h) according to the respective bottom surface areas and depths, extending a line indicating a profile of the resist surface after separation.

11. The method of claim 10, wherein in step (c) the increments have equal respective areas.

12. The method of claim 11, further comprising the step, after step (h), of repeating steps (c)-(h) as required until total resist-development time is equal to a predetermined resist-development time.

13. The method of claim 12, further comprising the step, if the predetermined resist-development time has been reached, of ending the simulation.

14. The method of claim 10, further comprising the step, after step (h), of estimating the profile of the pattern element after development of the resist.

15. The method of claim 10, wherein the resist is a negative resist.

16. The method of claim 15, wherein the rate of resist development utilized in step (d) is according to the expression:

$$R(D)=R_0[1-(C_{AS}(D)/C_0)^m]^\alpha$$

wherein $C_{AS}=1-\exp(-\gamma D)$; $\gamma$ is an experimental constant, in units of $m^3/J$; $R(D)$ is the dissolution speed of the resist, in units of m/s; D is cumulative exposure energy, in units of $J/m^3$; $R_0$ is an experimental constant, in units of m/s; and $C_0$, "m", and $\alpha$ are respective unit-less experimental constants.

17. The method of claim 10, wherein the resist is a positive resist.

18. The method of claim 17, wherein the rate of resist development utilized in step (d) is according to the expression:

$$R(D)=R_0(C_m+D/D_0)^\alpha$$

wherein $R(D)$ is in units of m/s; D is cumulative exposure energy, in units of $J/m^3$; $R_0$ is an experimental constant, in units of m/s; $D_0$ is an experimental constant, in units of $J/m^3$; and $C_m$ and $\alpha$ are respective unit-less experimental constants.

19. A computer-readable medium, comprising a resist-development-simulation program, including a method as recited in claim 1.

20. A computer-readable medium, comprising a resist-development-simulation program, including a method as recited in claim 10.

* * * * *

UNITED STATES PATENT AND TRADEMARK OFFICE
CERTIFICATE OF CORRECTION

PATENT NO. : 6,770,409 B2
DATED : August 3, 2004
INVENTOR(S) : Yamada

It is certified that error appears in the above-identified patent and that said Letters Patent is hereby corrected as shown below:

Column 4,
Line 41, "occurs" should read -- occur --.
Line 59, "designed" should read -- designated --.

Column 7,
Line 23, "t," should read -- $t_i$ --.

Column 8,
Line 23, "fine" should read -- line --.
Line 66, "to" should read -- $t_i$ --.

Signed and Sealed this

Tenth Day of May, 2005

JON W. DUDAS
*Director of the United States Patent and Trademark Office*